United States Patent
Zhang et al.

(10) Patent No.: US 11,728,369 B2
(45) Date of Patent: Aug. 15, 2023

(54) METHOD FOR FORMING CONTACTS APPLIED TO CMOS IMAGE SENSOR

(71) Applicant: Hua Hong Semiconductor (Wuxi) Limited, Wuxi (CN)

(72) Inventors: Dong Zhang, Wuxi (CN); Peng Huang, Wuxi (CN)

(73) Assignee: HUA HONG SEMICONDUCTOR (WUXI) LIMITED, Wuxi (CN)

( * ) Notice: Subject to any disclaimer, the term of this patent is extended or adjusted under 35 U.S.C. 154(b) by 186 days.

(21) Appl. No.: 17/361,910

(22) Filed: Jun. 29, 2021

(65) Prior Publication Data
US 2022/0130889 A1     Apr. 28, 2022

(30) Foreign Application Priority Data
Oct. 22, 2020   (CN) .......................... 202011139697.2

(51) Int. Cl.
*H01L 27/146*      (2006.01)
*H01L 21/768*      (2006.01)

(52) U.S. Cl.
CPC .. *H01L 27/14689* (2013.01); *H01L 21/76831* (2013.01); *H01L 21/76832* (2013.01); *H01L 27/14636* (2013.01); *H01L 27/14685* (2013.01)

(58) Field of Classification Search
CPC ............. H01L 27/146; H01L 27/14603; H01L 27/14605; H01L 27/14612; H01L 27/14614; H01L 27/14643; H01L 27/14683; H01L 21/8234; H01L 21/283418; H01L 29/6656; H01L 21/76831; H01L 21/76832
See application file for complete search history.

(56) References Cited

U.S. PATENT DOCUMENTS

| | | | |
|---|---|---|---|
| 2009/0057735 A1* | 3/2009 | Baek | H01L 27/14609 257/292 |
| 2014/0147982 A1* | 5/2014 | Ogata | H01L 29/6659 438/303 |

* cited by examiner

*Primary Examiner* — Thanhha S Pham
(74) *Attorney, Agent, or Firm* — Murtha Cullina LLP

(57) ABSTRACT

A method for forming contacts applied to a CMOS image sensor includes: forming a transmission gate structure; performing source and drain ion implantation processes to form source and drain; forming auxiliary sidewalls on the outer sides of the gate sidewalls, the material of the auxiliary sidewalls being the same as the material of the adjacent gate sidewalls; sequentially forming a silicide block layer, a contact etch stop layer and an interlayer dielectric layer; defining source and drain contact regions; performing etching processes to remove the interlayer dielectric layer and the contact etch stop layer corresponding to the source and drain contact regions sequentially; etching the silicide block layer by adopting a predetermined etching selection ratio to form source and drain contacts, wherein the etching rate of the silicide block layer is higher than the etching rate of the auxiliary sidewalls in the process of etching the silicide block layer.

10 Claims, 4 Drawing Sheets

METHOD FOR FORMING CONTACTS APPLIED TO CMOS IMAGE SENSOR

CROSS-REFERENCE TO RELATED APPLICATIONS

This application claims the priority to Chinese patent application No. CN 202011139697.2 filed at CNIPA on Oct. 22, 2020, entitled "METHOD FOR FORMING CONTACTS APPLIED TO CMOS IMAGE SENSOR", the disclosure of which is incorporated herein by reference in entirety.

TECHNICAL FIELD

The present application relates to the field of semiconductor manufacturing, and in particular to a method for forming contacts applied to a CMOS image sensor.

BACKGROUND

With the continuous development of semiconductor industry, the density and performance of devices in the IC manufacturing process are also improved. With the popularization of imaging products, CMOS image sensors (CIS) are widely applied, and the requirement on the performance of CIS becomes higher and higher.

CIS devices are semiconductor devices capable of converting optical signals to electrical signals. A CIS device includes millions of pixel units. Each pixel unit comprises a photodiode and some MOS transistors. The photodiode absorbs light energy and converts the light energy to current. In a 65 nm and above technology nodes process, for the pixel units of the CIS device, under the situation that the light energy collected by the photodiode is certain, in order to enhance the signal of the photodiode, i.e., to increase voltage, drain capacitance may be decreased. Currently, one way to decrease the drain capacitance is to decrease the implantation area of drain ion implantation. However, when the implantation area of the drain ion implantation is decreased, the requirement on the process precision of drain contacts is higher, that is, the contact must be in the drain ion implantation region. Otherwise, it is not easy to control the junction capacitance of the photodiode device, which generates unqualified product performance.

SUMMARY

According to some embodiments in this application, a method for forming contacts applied to CMOS image sensor is disclosed in the following steps: forming a transmission gate structure, the transmission gate structure comprising polysilicon gates and gate sidewalls; performing source and drain ion implantation processes on the two sides of the transmission gate structure to form source and drain; forming auxiliary sidewalls on the outer sides of the gate sidewalls, the material of the auxiliary sidewalls being the same as the material of the adjacent gate sidewalls; sequentially forming a silicide block layer, a contact etch stop layer and an interlayer dielectric layer; performing a photolithography process to define source and drain contact regions; performing etching processes to remove the interlayer dielectric layer and the contact etch stop layer corresponding to the source and drain contact regions sequentially; etching the silicide block layer by adopting a predetermined etching selection ratio to form source and drain contacts, wherein the etching rate of the silicide block layer is higher than the etching rate of the auxiliary sidewalls in the process of etching the silicide block layer.

In some examples, wherein the step of forming the auxiliary sidewalls on the outer sides of the gate sidewalls, comprising: forming a silicon nitride layer; performing a etching-back process to the silicon nitride layer to form auxiliary sidewalls with a predetermined width on the outer sides of the gate sidewalls.

In some examples, wherein the width range of the auxiliary sidewalls is 100 Å-500 Å.

In some examples, wherein the step of forming the silicon nitride layer, comprising depositing silicon nitride on a substrate to form a silicon nitride layer, wherein the depositing is performed via Chemical Vapour Deposition (CVD).

In some examples, wherein the thickness range of the deposited silicon nitride layer is 200 Å-500 Å.

In some examples, wherein the material of the silicide block layer is oxide.

In some examples, wherein the material of the contact etch stop layer is silicon nitride.

In some examples, wherein the material of the interlayer dielectric layer is oxide.

In some examples, wherein the method is applied to the 65 nm and above technology node.

Figure 1:
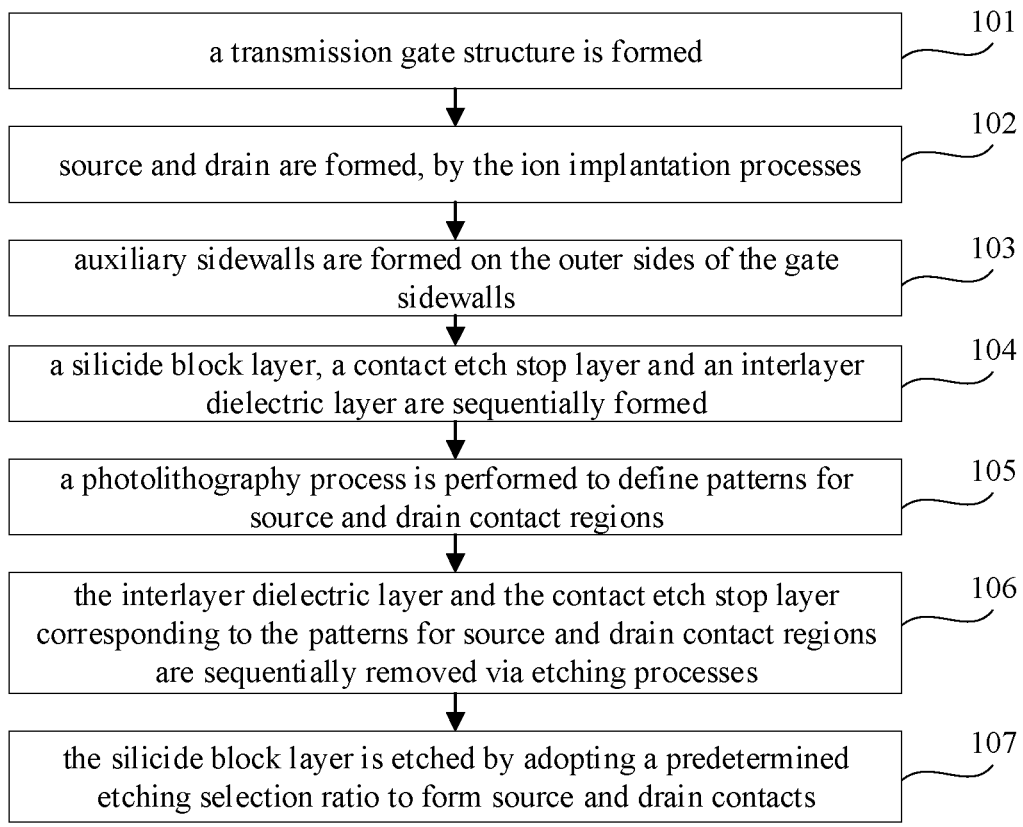
FIG. 1 is a flowchart of the method for forming contacts applied to a CMOS image sensor, according to one embodiment of the present application.

Reference numbers in the drawings are listed in the following:

21: substrate; 22: source/drain; 23: polysilicon gate; 24: auxiliary sidewall; 25: gate sidewall; 26: oxide layer; 27: silicon nitride layer; 28: silicide block layer; 29: contact etch stop layer; 30: interlayer dielectric layer; 31: regions corresponding to source and drain contacts.

DETAILED DESCRIPTION

The technical solution of the present application will be described below clearly and completely with reference to the drawings. Apparently, the described embodiments are partial embodiments of the present application, instead of all embodiments. Based on the embodiments of the present application, all other embodiments obtained by those skilled in the art without contributing any inventive labor shall fall into the scope of protection of the present application.

In the description of the present application, it should be noted that the orientation or position relationships indicated by the terms such as "center", "top", "bottom", "left", "right", "vertical", "horizontal", "inside" and "outside" are based on the orientation or position relationships illustrated in the drawings, for the purpose of conveniently describing the present application and simplifying the description, rather than indicating or implying that the device or component referred to must have a specific orientation and be constructed and operated in a specific orientation, and shall not be understood as limitations to the present application. In addition, the terms "first", "second" and "third" are used only for the purpose of description and shall not be understood as indicating or implying relative importance.

In the description of the present application, it should be noted that, unless otherwise specified and limited, the terms "mounting", "interconnection" and "connection" shall be understood in a broad sense. For example, it may be fixed connection, detachable connection, or integrated connection; it may be mechanical connection or electrical connection; it may be direct connection or indirect connection through an intermediate dielectric; it may also be internal connection of two components, wireless connection or wired connection. Those skilled in the art may understand the specific meaning of the above terms in the present application according to the specific circumstances.

In addition, the technical features involved in the different implementations of the present application described below can be combined with each other as long as they do not conflict with each other.

One embodiment of the present application provides a method for forming contacts applied to a CMOS image sensor, including the following steps illustrated in FIG. 1.

In step 101, a transmission gate structure is formed.

The transmission gate structure includes polysilicon gates and gate sidewalls.

A polysilicon layer is deposited on a substrate, and polysilicon gates are formed by etching the polysilicon layer.

In some examples, Lightly Doped Drain (LDD) implantation of source/drain is performed on the two sides of the polysilicon gates.

Sidewalls' material is deposited on the substrate and an etching-back process is performed until the tops of the polysilicon gates are exposed. Then, gate sidewalls are formed on the two sides of the polysilicon gates.

In some examples, the gate sidewalls comprise an oxide layer and a silicon nitride layer.

In step 102, source and drain are formed, by the ion implantation processes.

After doping ions are implanted into the two sides of the transmission gate structure, source and drain are formed.

In step 103, auxiliary sidewalls are formed on the outer sides of the gate sidewalls.

The auxiliary sidewalls are in contact with gate sidewalls. The height of the auxiliary sidewalls is lower than the height of the gate sidewalls. The auxiliary sidewalls are located above source and drain.

The material of the auxiliary sidewalls is the same as the material of the adjacent gate sidewalls.

Figure 2:
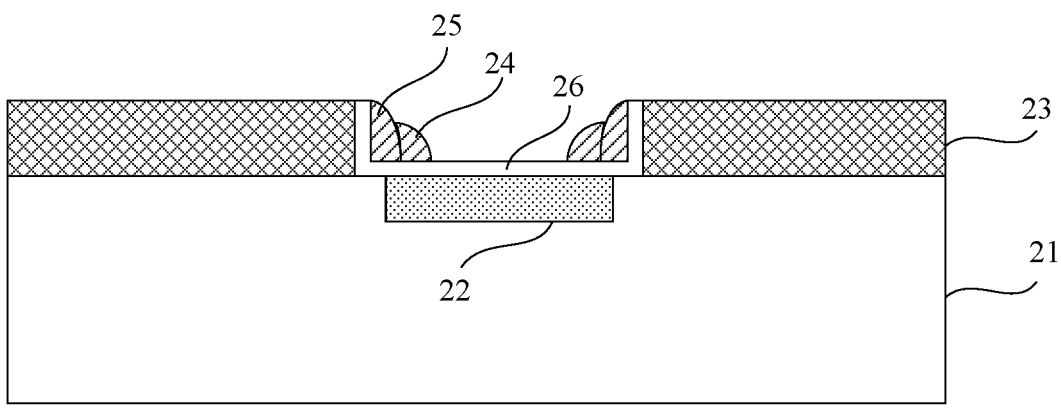
FIG. 2 shows the device cross sectional view after the auxiliary sidewalls are formed, according to one embodiment of the present application.

FIG. 2 illustrates the device cross sectional view after the auxiliary sidewalls are formed, according to one embodiment of the present application.

The auxiliary sidewalls 24 are located above the source/drain 22 in the substrate 21, and the tops of the two ends of the source/drain 22 are covered by the auxiliary sidewalls 24.

An oxide layer is formed on the surfaces of the source and drain.

In step 104, a silicide block layer, a contact etch stop layer and an interlayer dielectric layer are sequentially formed.

A silicide block layer, a contact etch stop layer and an interlayer dielectric layer are sequentially formed on the substrate. The silicide block layer, the contact etch stop layer and the interlayer dielectric layer are stacked from bottom to top.

In some examples, the materials of the silicide block layer and the interlayer dielectric layer are the same, and the materials of the contact etch stop layer and the auxiliary sidewalls are the same.

In step 105, a photolithography process is performed to define patterns for source and drain contact regions.

Photoresists are coated onto the substrate, patterns for source and drain contact regions are formed by exposing and developing, patterns for source and drain contact regions correspond to the source and drain in the substrate.

Due to the influence of overlay margin, the positions of patterns for source and drain contact regions may be shifted, that is, patterns for source and drain contact regions do not completely correspond to the source and drain in the substrate, and a part of patterns for source and drain contact regions may be located on the outer sides of the source and drain.

In step 106, the interlayer dielectric layer and the contact etch stop layer corresponding to the patterns for source and drain contact regions are sequentially removed via etching processes.

The silicide block layer below the patterns for source and drain contact regions is exposed, after the interlayer dielectric layer and the contact etch stop layer below the patterns for source and drain contact regions are removed.

In step 107, the silicide block layer is etched by adopting a predetermined etching selection ratio to form source and drain contacts.

During the process of etching the silicide block layer, the etching rate of the silicide block layer is higher than the etching rate of the auxiliary sidewalls.

The predetermined etching selection ratio is predetermined.

The silicide block layer below the patterns for source and drain contact regions is etched by adopting a predetermined etching selection ratio until the tops of the source and drain regions are exposed, thereby forming source and drain contacts.

During the process of etching the silicide block layer, since the etching rate of the silicide block is higher than the etching rate of the auxiliary sidewalls, even if there is an alignment deviation during the formation of the patterns for source and drain contact regions, and a part of the patterns for source and drain region contact regions is shifted out of the source and drain, it can be guaranteed that the source and drain contacts formed via etching processes fall into the range of the source and drain.

In summary, by forming the auxiliary sidewalls on the two sides of the gate sidewalls, removing the interlayer dielectric layer and the contact etch stop layer by adopting a normal method, and then etching the silicide block layer by adopting the etching process with high etching selection ratio of the silicide block layer to the auxiliary sidewalls, the source and drain contacts are formed. The problem that decreasing the implantation area of the source and drain when a CIS device is manufactured may lead to unqualified device performance has been overcome.

The benefit of this technique includes: the contacts to be self-aligned with the source and drain even though the source and drain implantation area is decreased, and the performance of the CIS device can be guaranteed.

After the source and drain contacts are formed, the other processes of the CIS device are continued.

The method for forming the contacts applied to the CMOS image sensor provided by the embodiments of the present application can be applied to a 65 nm technology node.

In the CIS product at the 65 nm technology node, the contact etch stop layer is introduced below the interlayer dielectric layer, and the material of the contact etch stop layer is silicon nitride; the material of the interlayer dielectric layer above the contact etch stop layer is oxide, and the material of the silicide block layer below the contact etch stop layer is oxide.

Another embodiment of the present application provides a method for forming contacts applied to a CMOS image sensor, including the following steps.

In step 201, pixel units are defined on the substrate.

The pixel units are used to form CIS devices.

The pixel unit includes a photodiode region and a MOS transistor region. The photodiode region is used to form a photodiode, and the MOS transistor region is used to form some CMOS transistor circuits for obtaining the output current of the photodiode.

In step 202, a photodiode is formed in the substrate.

Doping ions are implanted into a photodiode region in a substrate of a first conducting type to form a heavily doped region of a second conducting type; the first conducting type is opposite to the second conducting type; in the photodiode region, the substrate of the first conducting type and the heavily doped region of the second conducting type constitute the photodiode.

In step 203, a transmission gate structure is formed.

The transmission gate structure includes polysilicon gates and gate sidewalls.

A transmission gate structure of a CMOS transistor is formed in the MOS transistor region, and there is a gate oxide layer between the transmission gate structure and the substrate.

In one example, the gate sidewalls comprise an oxide layer and a silicon nitride layer. The silicon nitride layer is located on the outer side of the oxide layer.

In step 204, source and drain ion implantation processes are performed on the two sides of the transmission gate structure to form source and drain regions.

Figure 3:
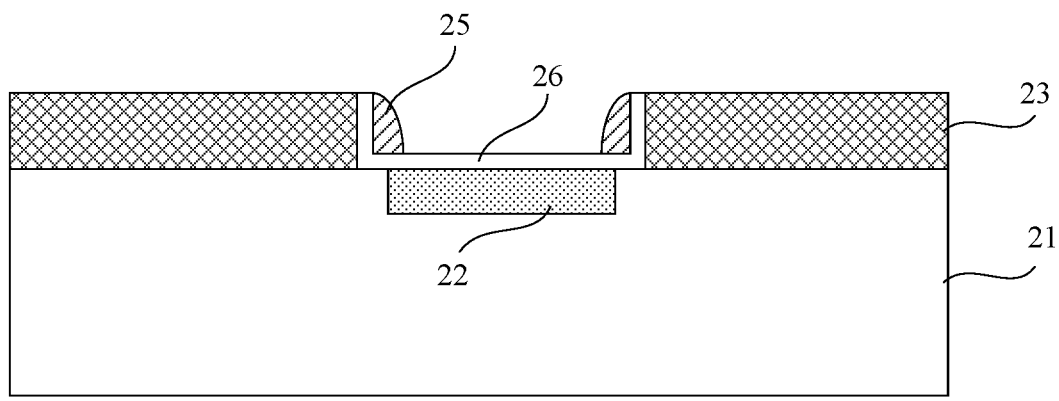
FIG. 3 is a schematic diagram of a semiconductor device with polysilicon gate and source/drain.

FIG. 3 is a schematic diagram of a semiconductor device with polysilicon gate and source/drain.

A transmission gate structure is formed on the surface of a substrate 21. The transmission gate structure includes polysilicon gates 23 and gate sidewalls 25. Source/drain 22 are formed in the substrate 21, and the source/drain 22 are located on the outer side of the transmission gate structure.

In step 205, a silicon nitride layer is formed.

Silicon nitride is deposited on the substrate through a CVD process.

In one example, the thickness of the deposited silicon nitride layer is 200 Å-500 Å.

Figure 4:
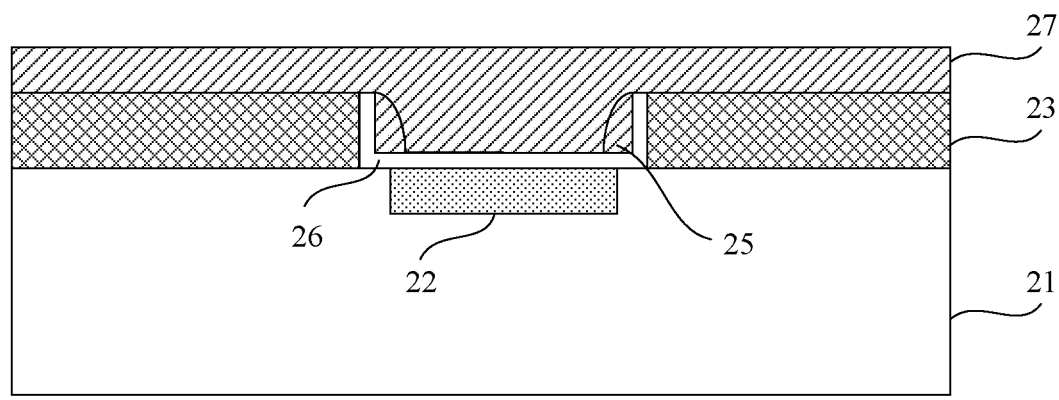
FIG. 4 shows the device cross sectional view after a silicon nitride layer is formed on the device, according to one embodiment of the present application.

FIG. 4 illustrates the device cross sectional view after a silicon nitride layer is formed on the device, according to one embodiment of the present application.

Referring to FIG. 4, a silicon nitride layer 27 is formed on the substrate 21, the silicon nitride layer 27 covers the transmission gate structure and the source/drain 22, and the silicon nitride layer 27 is used to form auxiliary sidewalls.

In step 206, auxiliary sidewalls with a predetermined width are formed on the outer sides of the gate sidewalls, by performing a etching-back process to the silicon nitride layer.

The silicon nitride layer is etched until the tops of polysilicon gates are exposed, and auxiliary sidewalls are formed on the two sides of gate sidewalls.

The width range of the auxiliary sidewalls is 100 Å-500 Å. The actual width of the auxiliary sidewalls is determined according to the actual needs, which is not limited in the embodiments of the present application.

Referring to FIG. 2, the auxiliary sidewalls 24 are formed on the outer sides of the gate sidewalls 25, the auxiliary sidewalls 24 are lower than the gate sidewalls 25, and the auxiliary sidewalls 24 are located above the source/drain regions 22.

The material of the auxiliary sidewalls 24 is silicon nitride, and the material of the auxiliary sidewalls 24 is the same as the material of the adjacent gate sidewalls.

In step 207, a silicide block layer is formed on the substrate.

In one example, the material of the silicide block layer is oxide.

Figure 5:
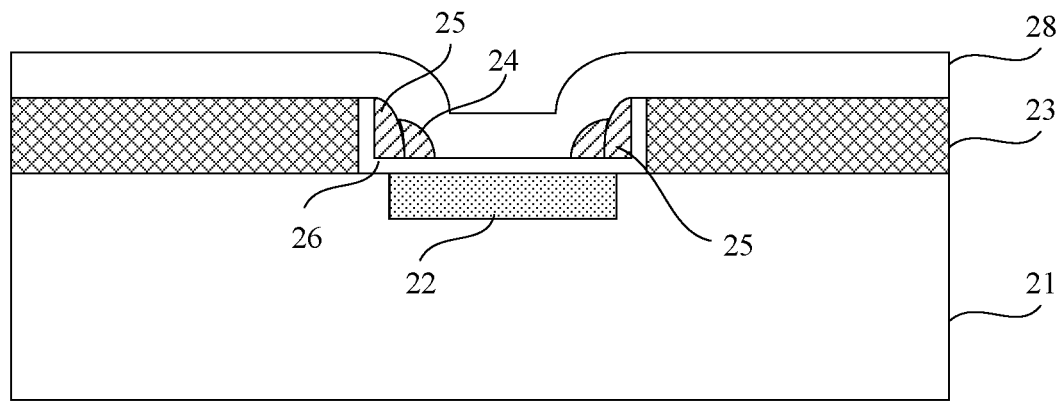
FIG. 5 shows the device cross sectional view with the auxiliary sidewalls after a silicide block layer is formed, according to one embodiment of the present application.

FIG. 5 illustrates the device cross sectional view with the auxiliary sidewalls after a silicide block layer is formed, according to one embodiment of the present application.

Referring to FIG. 5, a silicide block layer 28 is formed on the substrate 21.

In step 208, a contact etch stop layer is formed above the silicide block layer.

In one example, the material of the contact etch stop layer is silicon nitride.

Figure 6:
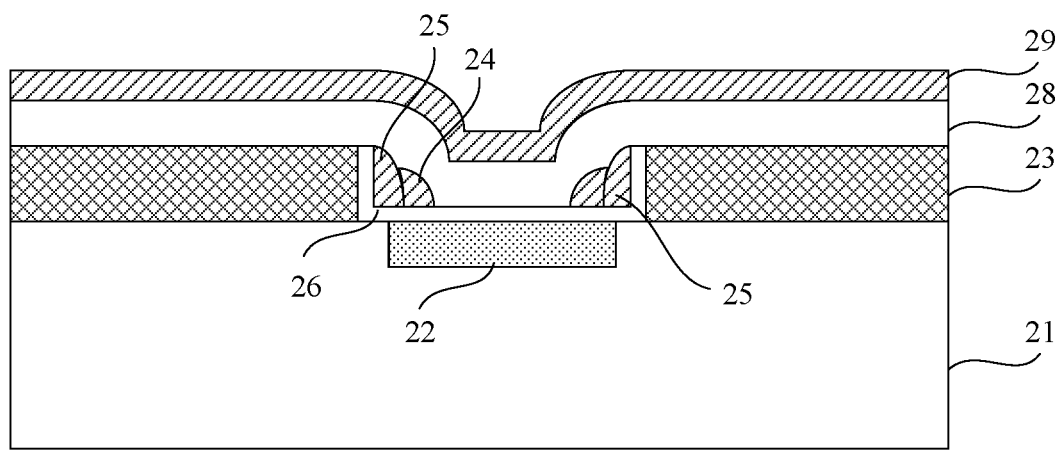
FIG. 6 shows the device cross sectional view with the auxiliary sidewalls after a contact etch stop layer is formed, according to one embodiment of the present application.

FIG. 6 illustrates the device cross sectional view with the auxiliary sidewalls after a contact etch stop layer is formed, according to one embodiment of the present application.

Referring to FIG. 6, a contact etch stop layer 29 is formed above the silicide block layer 28.

In step 209, an interlayer dielectric layer is formed above the contact etch stop layer.

Figure 7:
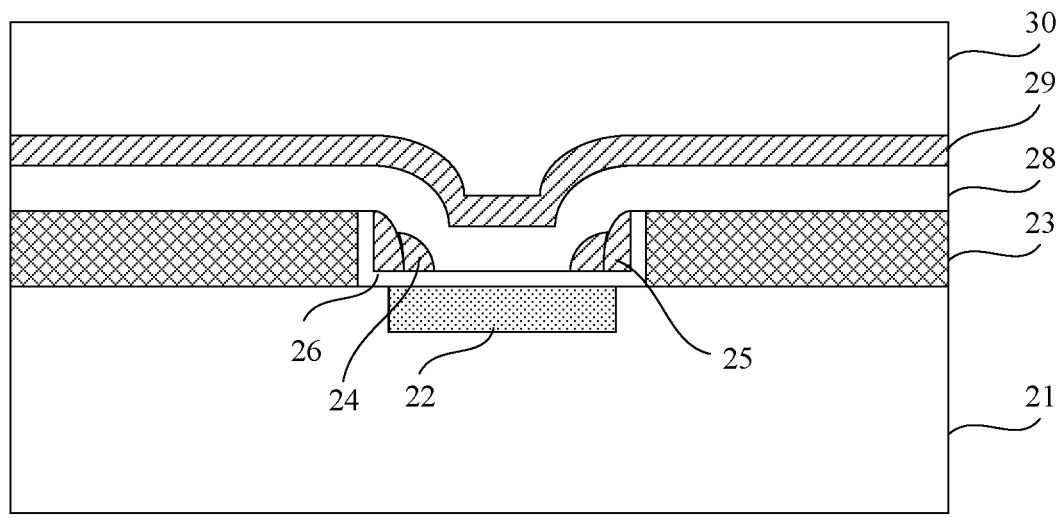
FIG. 7 shows the device cross sectional view with the auxiliary sidewalls after the interlayer dielectric layer is formed, according to one embodiment of the present application.

FIG. 7 illustrates the device cross sectional view with the auxiliary sidewalls after the interlayer dielectric layer is formed, according to one embodiment of the present application.

Referring to FIG. 7, the interlayer dielectric layer 30 covers the contact etch stop layer 29.

In one example, the material of the interlayer dielectric layer is oxide.

In step 210, the patterns for source and drain contact regions are defined through a photolithography process.

The patterns for source and drain contact regions correspond to the source and drain in the substrate. In the ideal case, the patterns for source and drain contact regions completely correspond to the source regions and the drain, that is, the patterns for source and drain contact regions completely fall into the range of the source and drain. However, a part of patterns for source and drain contact regions may be located on the outer sides of the source/drain in case of a deviation in overlay margin.

In step 211, the interlayer dielectric layer and the contact etch stop layer corresponding to the patterns for source and drain contact regions are sequentially removed through etching processes.

In step 212, the silicide block layer is etched by adopting a predetermined etching selection ratio to form source and drain contacts.

The etching rate of the silicide block layer is higher than the etching rate of the auxiliary sidewalls during the process of etching the silicide block layer.

Figure 8:
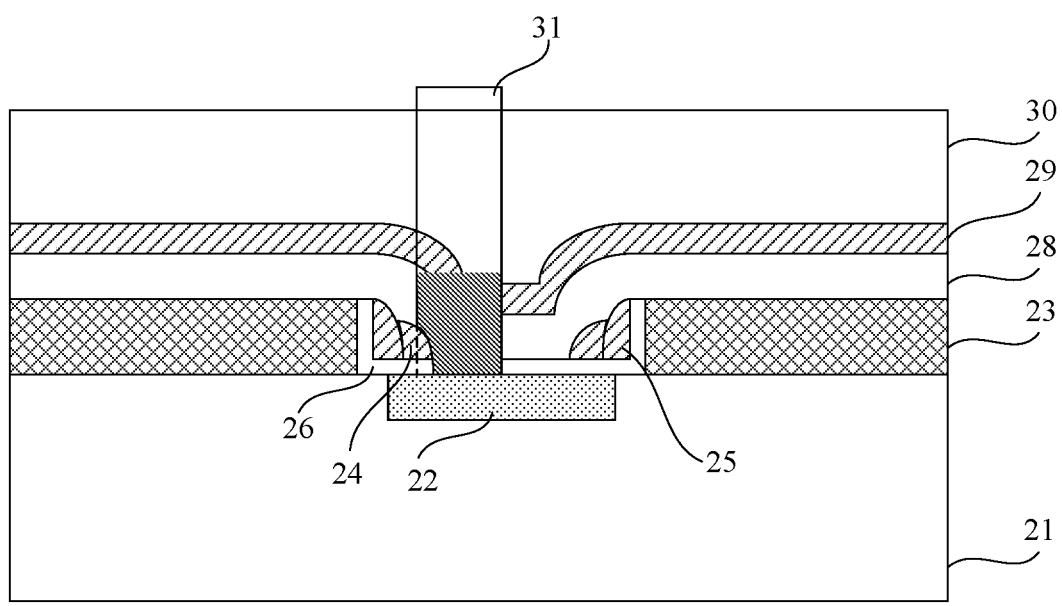
FIG. 8 shows the device cross sectional view with regions corresponding to source and drain contacts.

In one example, referring to FIG. 8, a region 31 corresponds to the pattern for source/drain contact region. When etching processes are performed to form the source and drain contacts, the interlayer dielectric layer 30 and the contact etch stop layer 29 in the region 31 are successively removed, the silicide block layer 28 in the region 31 is exposed. Since the material of the silicide block layer 28 is oxide, and the materials of the outer layer of the gate sidewalls 25 and the auxiliary sidewalls 24 are silicon nitride, the silicide block layer 28 is etched by adopting an etching process with high etching selection ratio of oxide to nitride. When the tops of the source/drain 22 are exposed, etching process is stopped.

Since the etching rate of silicon nitride is higher than the etching rate of oxide (outer layers of auxiliary sidewalls 24 and gate sidewalls 25) in the process of etching the silicide block layer 28, when the silicide block layer in the region 31 is etched completely and the tops of source/drain 22 in the region 31 are exposed, the loss of the auxiliary sidewalls 24 in the region 31 is very small, such that the formed source and drain contacts can be limited in the range of the source and drain, thus avoiding the problem that the junction capacitance of the photodiode is influenced since the source and drain contacts fall into regions outside the source and drain under the situation that the implantation area of the source and drain is decreased.

In the manufacturing processes of semiconductor devices, the processes that influence the process precision of contacts mainly include photolithography processes and etching processes. The overlay margin control of the photolithography process is very important. In order to avoid the influence of the position shift of the contacts in the photolithography processes, the self-alignment process may be adopted to form the contacts.

In the method for forming the contacts applied to the CMOS image sensor according to the embodiments of the present application, after the source and drain ion implantation processes of the CIS device are performed, the auxiliary sidewalls are formed. During the etching processes performed to form the source and drain contacts, after the interlayer dielectric layer and the contact etch stop layer are removed by etching processes, the silicide block layer is etched by adopting an etching process with a high etching selection ratio of oxide (silicide block layer) to silicon nitride (auxiliary sidewalls and outer layers of gate sidewalls), and the auxiliary sidewalls are used to realize contact self-alignment, such that even if there is a deviation of overlay margin in the photolithography processes of the contacts, the source and drain contacts can still fall into the range of the source and drain, and the process window can be guaranteed.

Obviously, the foregoing embodiments are merely for clear description of made examples and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

What is claimed is:

1. A method for forming contacts applied to a CMOS image sensor, comprising:
   forming a transmission gate structure on a substrate, the transmission gate structure comprising polysilicon gates and gate sidewalls;
   performing source and drain ion implantation processes on the two sides of the transmission gate structure to form source and drain;
   forming auxiliary sidewalls on the outer sides of the gate sidewalls, the material of the auxiliary sidewalls being the same as the material of the adjacent gate sidewalls;
   sequentially forming a silicide block layer, a contact etch stop layer and an interlayer dielectric layer over the transmission gate structure and the source and the drain;
   performing a photolithography process to define source and drain contact regions over the source and the drain;
   performing etching processes to remove the interlayer dielectric layer and the contact etch stop layer corresponding to the source and drain contact regions sequentially;
   after performing etching processes to remove the interlayer dielectric layer and the contact etch stop layer, etching the silicide block layer by adopting a predetermined etching selection ratio to form source and drain contacts, wherein the etching rate of the silicide block layer is higher than the etching rate of the auxiliary sidewalls in the process of etching the silicide block layer.

2. The method for forming contacts applied to a CMOS image sensor, according to claim 1, wherein the step of forming the auxiliary sidewalls on the outer sides of the gate sidewalls, comprising:
   forming a silicon nitride layer on the substrate;
   performing a etching-back process to the silicon nitride layer to form the auxiliary sidewalls with a predetermined width on the outer sides of the gate sidewalls.

3. The method for forming contacts applied to a CMOS image sensor, according to claim 2, wherein the width range of the auxiliary sidewalls is 100 Å-500 Å.

4. The method for forming contacts applied to a CMOS image sensor, according to claim 2, wherein the step of forming the silicon nitride layer, comprising:
   depositing silicon nitride on a substrate to form the silicon nitride layer, wherein the depositing is performed via Chemical Vapour Deposition (CVD).

5. The method for forming contacts applied to a CMOS image sensor, according to claim 4, wherein the thickness range of the deposited silicon nitride layer is 200 Å-500 Å.

6. The method for forming contacts applied to a CMOS image sensor, according to claim 1, wherein the material of the silicide block layer is oxide.

7. The method for forming contacts applied to a CMOS image sensor, according to claim 1, wherein the material of the contact etch stop layer is silicon nitride.

8. The method for forming contacts applied to a CMOS image sensor, according to claim 1, wherein the material of the interlayer dielectric layer is oxide.

9. The method for forming contacts applied to a CMOS image sensor, according to claim 1, wherein before forming the transmission gate structure, the method further comprising:
   forming a photodiode in the substrate.

10. The method for forming contacts applied to a CMOS image sensor, according to claim 1, wherein the method is applied to a 65 nm technology node.

* * * * *